(12) United States Patent
Tanokuchi et al.

(10) Patent No.: US 10,271,469 B2
(45) Date of Patent: Apr. 23, 2019

(54) COMPONENT SUPPLY DEVICE AND COMPONENT INSTALLATION DEVICE

(71) Applicant: YAMAHA HATSUDOKI KABUSHIKI KAISHA, Shizuoka (JP)

(72) Inventors: Akito Tanokuchi, Tokyo (JP); Tsutomu Yanagida, Kumagaya (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 533 days.

(21) Appl. No.: 14/386,971

(22) PCT Filed: Feb. 20, 2013

(86) PCT No.: PCT/JP2013/054212
§ 371 (c)(1),
(2) Date: Jan. 15, 2015

(87) PCT Pub. No.: WO2013/140929
PCT Pub. Date: Sep. 26, 2013

(65) Prior Publication Data
US 2015/0121689 A1    May 7, 2015

(30) Foreign Application Priority Data
Mar. 23, 2012    (JP) .................................. 2012-067345

(51) Int. Cl.
*H05K 13/02*    (2006.01)
*H05K 13/04*    (2006.01)
(Continued)

(52) U.S. Cl.
CPC ........... *H05K 13/02* (2013.01); *H05K 13/021* (2013.01); *H05K 13/04* (2013.01);
(Continued)

(58) Field of Classification Search
CPC ...... B65H 19/10; B65H 19/12; B65H 19/123; B65H 19/126; B65H 19/14; H05K 13/02;
(Continued)

(56) References Cited

U.S. PATENT DOCUMENTS

2003/0219330 A1    11/2003    Lyndaker et al.
2010/0180435 A1*   7/2010    Shin ..................... B65H 37/002
                                                        29/740
(Continued)

FOREIGN PATENT DOCUMENTS

CN        1778157 A      5/2006
CN        101031198 A    9/2007
(Continued)

OTHER PUBLICATIONS

Machine Translation of description section of JPH02-165696 provided by JPO website (Jplatpat).*
(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

The invention provides a component supply device which is small and can supply electronic components efficiently. The component supply device 1 mounts a component supply tape T and exposes the electronic components out of the component supply tape T to provide to a component installation device 7 which mounts the electronic components on a circuit board. The component supply device 1 has a replenishment device 2 which replenishes a new component supply tape (Tb) when a preceding component supply tape Ta runs out, and a sensor S which detects the run-out of the preceding component supply tape Ta. The replenishment device 2 has a reel holding section 21 on which reels 20 wound with the component supply tape T are inserted, and a standby section 5 of the component supply tape T. When the sensor S detects that the preceding component supply tape Ta runs out and issues a detection signal, the component supply tape T is moved from the standby section to be replenished.

20 Claims, 12 Drawing Sheets

(51) Int. Cl.
*H05K 13/08* (2006.01)
*B65H 19/10* (2006.01)

(52) U.S. Cl.
CPC ..... *H05K 13/0417* (2013.01); *H05K 13/0419* (2018.08); *H05K 13/08* (2013.01); *B65H 19/10* (2013.01); *Y10T 29/53178* (2015.01)

(58) Field of Classification Search
CPC .. H05K 13/021; H05K 13/04; H05K 13/0417; H05K 13/08; Y10T 29/53174; Y10T 29/531748; Y10T 29/53183
USPC ... 242/555.3, 558, 559, 559.1, 559.2, 559.3, 242/559.4, 560, 560.1, 560.2, 560.3, 561, 242/564.4; 29/739, 740, 741
See application file for complete search history.

(56) References Cited

U.S. PATENT DOCUMENTS

| | | | |
|---|---|---|---|
| 2010/0186901 A1 | 7/2010 | Ikeda et al. | |
| 2010/0239401 A1* | 9/2010 | Kim | B65H 37/002 414/412 |
| 2013/0028701 A1 | 1/2013 | Sumi | |

FOREIGN PATENT DOCUMENTS

| | | |
|---|---|---|
| CN | 201319697 Y | 9/2009 |
| JP | H01-208900 A | 8/1989 |
| JP | 2-165696 A | 6/1990 |
| JP | H02-143600 A | 6/1990 |
| JP | H02-165696 A | 6/1990 |
| JP | H05-167298 A | 7/1993 |
| JP | 2002-246790 A | 8/2002 |
| JP | 2005-539370 A | 12/2005 |
| JP | 2010-199567 A | 9/2010 |
| WO | 2004/095902 A1 | 11/2004 |
| WO | 2011/132386 A1 | 10/2011 |

OTHER PUBLICATIONS

An Office Action issued by the Chinese Patent Office dated Mar. 31, 2016, which corresponds to Chinese Patent Application No. 201380026358.5 and is related to U.S. Appl. No. 14/386,971, with English language abstract.

International Search Report (PCT/ISA/210) dated Apr. 9, 2013 with English translation (four pages).

Japanese-language Written Opinion (PCT/ISA/237) dated Apr. 9, 2013 (three pages).

* cited by examiner

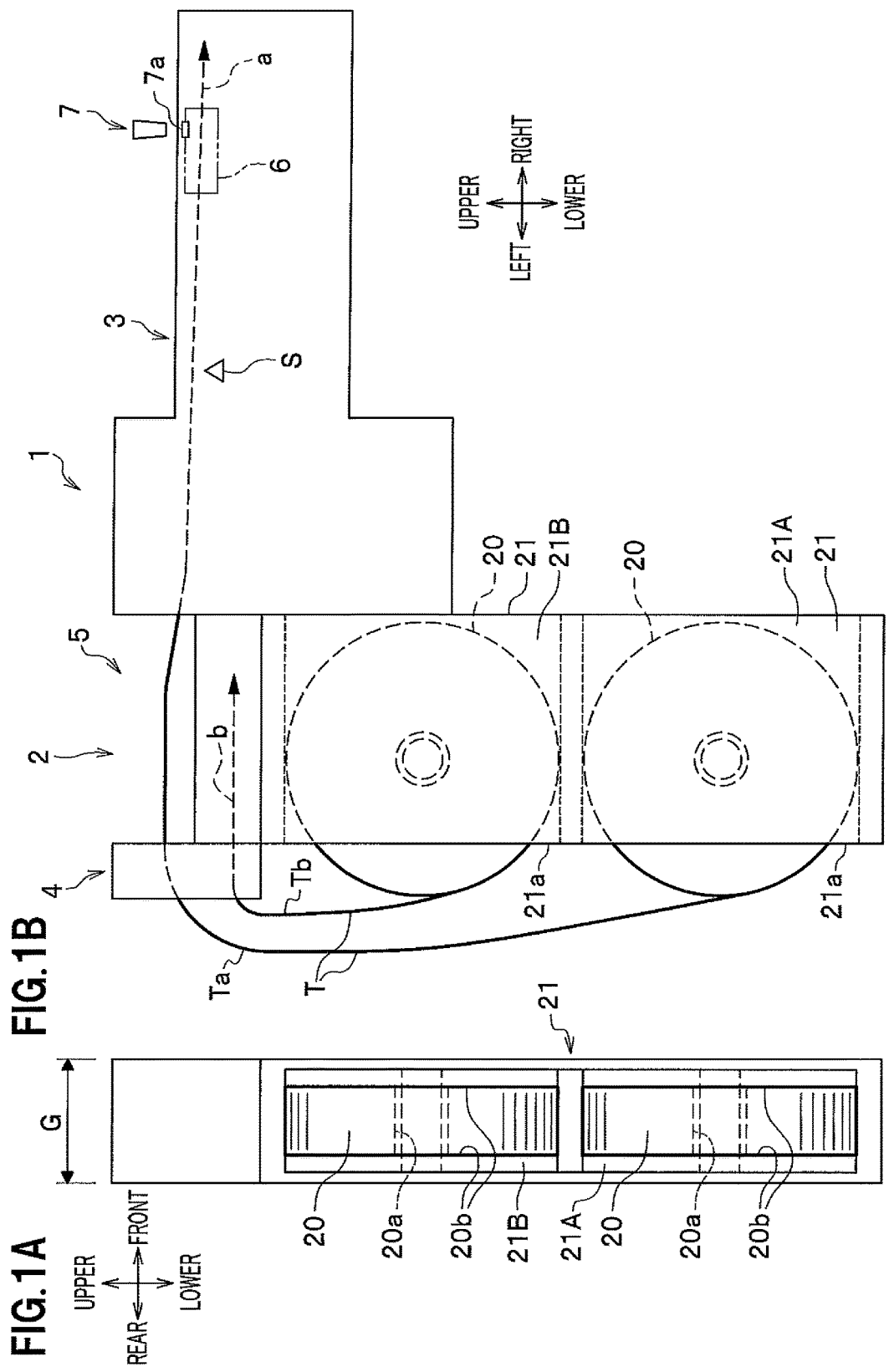

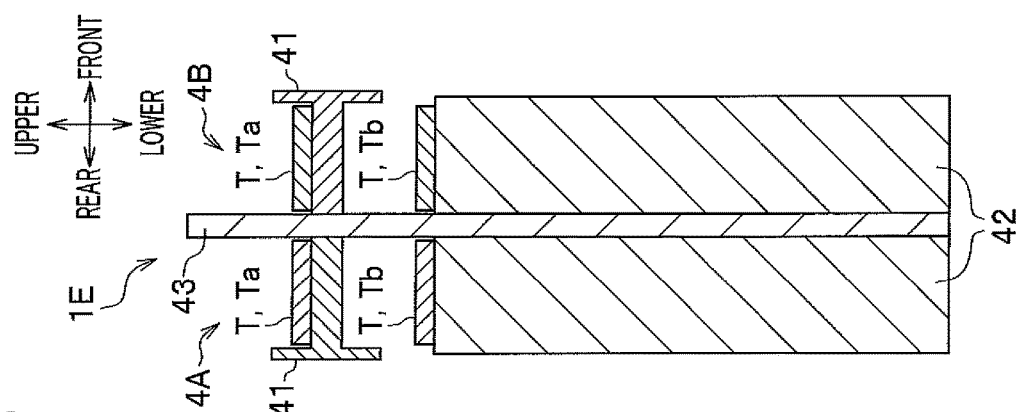
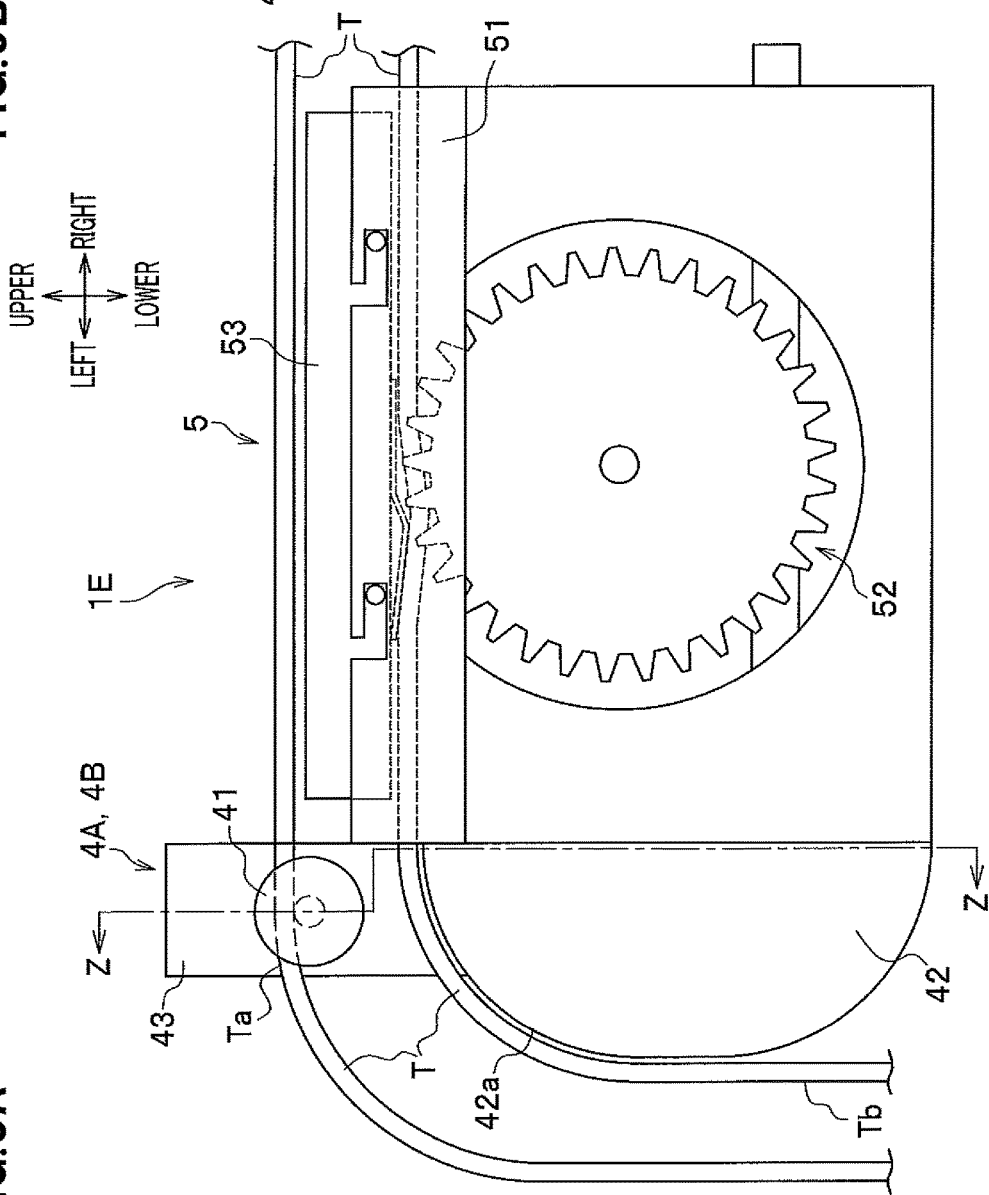

COMPONENT SUPPLY DEVICE AND COMPONENT INSTALLATION DEVICE

TECHNICAL FIELD

The invention relates to a component supply device and a component installation device (an electronic chips feeder and an electronic chips mounter). More specifically, the invention relates to the component supply device which exposes electronic components (electronic chips) in component housings of a component supply tape to take out the electronic components and relates to the component installation device which installs the electronic components on a printed circuit board using the component supply device. The component supply tape includes a carrier tape in which the component housings accommodating the electronic components are arranged in line at a predetermined interval and a cover tape (electronic chips tape) which covers the component housings.

BACKGROUND ART

Conventionally, in case that electronic components such as electronic chips are installed on an electric circuit board (a printed circuit board which is referred to as a circuit board hereinafter) of an electronic device, a component supply tape which accommodates electronic components at a predetermined interval and is wound on a reel is unreeled by a component supply device to automatically supply the electronic components consecutively. Then, the electronic components are installed on a circuit board by a component installation device (for example, see Patent Literatures 1 and 2).

FIG. 10 is a perspective view showing the component supply tape used in the conventional component supply device. FIG. 11 is a schematic plan view showing a structure of the conventional component installation device.

First of all, a component supply tape T100 will be explained with reference to FIG. 10.

The component supply tape T100 includes a carrier tape T200 made of cardboard or the like, electronic components (not shown) accommodated in component housings T210 formed in the carrier tape T200, and a cover tape T300. The cover tape T300 is stuck on the carrier tape T200 to cover the component housings T210 such that the electronic components do not jump out from the component housings T210.

The carrier tape T200 is formed with the component housings T210 and feed holes T220 with which feeding force for moving the component supply tape T100 is applied to the carrier tape T200. The cover tape T300 is stuck on the carrier tape T200 and is made of PET resin material to prevent the electronic components enclosed in the component housings T210 from falling off from the carrier tape T200. The component supply tape T100 formed like this is wound on a reel 300 (see FIG. 12) and is set in a component supply device 530 (see FIG. 11) which supplies the electronic components to a component installation device 500.

Next, the conventional component supply device will be explained. The component supply tape T100 wound on the reel 300 is supported by a guide to be fed by a feeding device (not shown). Then, an electronic component exposure device (not shown) exposes the electronic components from the component supply tape T100 (see FIG. 10). Electronic component suction/mount devices 540 (see FIG. 11) move up and down, by which the exposed electronic components are held at tip portions of the electronic component suction/mount devices 540.

As shown in FIG. 11, in the conventional component installation device (electronic component mount device) 500 such as disclosed in Patent Literature 1, portions of the component supply devices 530 are detachably provided in parallel on a base section 590. The component supply devices 530 supply various electronic components at takeout positions (component suction positions) of respective electronic components one by one. The more the component supply devices 530 are provided, the more the kinds of electronic components ready for the component installation device 500 can be increased. Therefore, groups of component supply devices 530 are arranged at both right and left sides of a circuit board feeding conveyer 510 at a gap interval approximately equal to or less than 1 mm.

The circuit board feeding conveyer 510 positions circuit boards 520 to be fed at predetermined positions. After the electronic components are mounted on the circuit boards 520, the circuit board feeding conveyer 510 feeds the circuit boards 520 in a predetermined feeding direction. A pair of right and left X-beams 550 extends in the feeding direction where the circuit boards 520 are aligned, and actuators (not shown) such as linear motors are attached on both ends thereof.

The X-beams 550 are movably supported along Y-beams 570 which are arranged in a direction orthogonal to the feeding direction of the circuit boards 520 and are movably provided by the actuators (not shown) between the component supply device 530 and the circuit boards 520. The electronic component suction/mount devices 540 which move in a longitudinal direction of the X-beams 550 are provided on the X-beams 550. Further, the component installation device 500 is driven by a driving system (not shown).

The component installation device 500 is driven as described above and the electronic components are sucked in the component supply devices 530 to be mounted on the circuit boards 520. Recognition cameras 560 and nozzle storage sections 580 are arranged between the component supply devices 530 and the circuit board feeding conveyors 510. The recognition cameras 560 obtain positional displacement information on the electronic components sucked by the electronic component suction/mount devices 540 on the component supply devices 530. The recognition cameras 560 can recognize positional displacement in a circuit board feeding direction and a direction orthogonal to the circuit board feeding direction, rotational angles, presence of the sucked electronic components, and the like by capturing the electronic components.

Further, when the electronic components are moved from the component supply devices 530 onto the circuit boards 520 by moving the X-beams 550 and the Y-beams 570 simultaneously, the electronic component suction/mount devices 540 pass on the recognition cameras 560. This causes the recognition cameras 560 to obtain the positional displacement information on the electronic components. The nozzle storage sections 580 store a plurality of suction nozzles (not shown) necessary for sucking and mounting various electronic components. The suction nozzles are attached to the electronic component suction/mount devices 540. In case that an instruction for attaching a suction nozzle corresponding to an electronic component is issued, the electronic component suction/mount device 540 is moved to the nozzle storage section 580 by the simultaneous movement of the X-beam 550 and the Y-beam 570, and the suction nozzles are changed.

Patent Literature 1 discloses the component supply devices and the electronic component exposure device. In the component supply device 530, in case that the mounted component supply tape T100 runs out and an operator does not replenish a new component supply tape T100 immediately, the component installation device 500 cannot mount the electronic components on the circuit boards 520, thereby causing the component installation device 500 to stop.

To solve the problem, Patent Literature 2 discloses a component supply device having a replenishment device which replenishes the new component supply tape T100 automatically when the preceding component supply tape T100 is detected to be run out, and an electronic component exposure device.

In the electronic component exposure device, a cutter device which cuts the cover tape T300 to expose the electronic components is provided toward above with respect to a tape feeding path. When the component supply tape T100 is fed, the cover tape T300 is cut out so that the electronic components are exposed to be taken out.

FIGS. 12A to 12C are diagrams of the automatic replenishment device in Patent Literature 2. FIG. 12A is a left side view of a main part, FIG. 12B is a left side view of a cassette and FIG. 12C is a front view of the main part in the automatic replenishment device.

As shown in FIGS. 12A to 12C, an automatic replenishment device 100 for the conventional component supply tape T100 is provided with a component supply device 200. In the automatic replenishment device 100, a holder 410 having an empty reel 310 and a holder 400 having a reel 300 wound with the component supply tape T100 need to be changed simultaneously at the time of replenishment.

The automatic replenishment device 100 is configured such that the reel 300 having wider width than the component supply tape T100 is inserted in the holder 400 having wider width than the reel 300, and the holder 400 is inserted in a holder changer 600 having wider width than the holder 400. Therefore, the automatic replenishment device 100 is relatively larger than the component supply device 200 which can be accommodated in full width F approximately equivalent to the width of the component supply tape T100, and the full width F is wider than that of the component supply device 200. Since the component supply devices 200 are set adjacently in the full width direction F in the component installation device 500, the number of component supply devices 200 settable in the component installation device 500 decreases if the full width F is wider.

PRIOR ART DOCUMENTS

Patent Literatures

Patent Literature 1: JP2010-199567A
Patent Literature 2: JPH02-165696A

SUMMARY OF THE INVENTION

Problems to be Solved by the Invention

Since the automatic replenishment device for the component supply tapes disclosed in Patent Literature 2 has wide width, the number of component supply devices settable in the component installation device decreases.

This leads to a decrease in types of electronic components ready for the component installation device. Therefore, the automatic replenishment device disclosed in Patent Literature 2 needs to reduce the full width thereof.

The invention is oriented for solving the above problem and aims to provide a component supply device and a component installation device which are smaller and can supply electronic components efficiently.

Means to Solve the Problems

To solve the above problem, a component supply device according to the invention mounts a component supply tape and exposes an electronic component from the component supply tape to supply the electronic component to a component installation device that mounts the electronic component on a circuit board having: a replenishment device that replenishes a new component supply tape when a preceding component supply tape runs out; and a sensor that detects run-out of the preceding component supply tape, wherein the replenishment device has a reel holding section on which a reel wound with the component supply tape is inserted, and a standby section for the component supply tape, and, when the sensor detects the run-out of the preceding component supply tape and generates a detection signal, the component supply tape is moved from the standby section to be replenished.

According to the structure, when the component supply tape is replenished and the sensor issues a driving command after detecting that the preceding component supply tape detects runs out, the component supply tape is replenished by moving only the component supply tape from the standby section. Therefore, it is not necessary to move the reels. As a result, since it is not necessary to move the reels during the replenishment of the component supply tape, it is possible to make a structure of the replenishment device having the reels smaller and it is possible to prevent the component installation device from stopping, without decreasing the number of electronic component types ready for the component installation device.

Further, the component installation device holds the electronic component supplied by the component supply device at a component takeout section to install the electronic component on the circuit board.

According to the structure, the component supply device with the replenishment device for the component supply tape is provided, which prevents the device from stopping due to the run-out of the component supply tape and can provide the components installation device having many electronic component types.

Effect of the Invention

The present invention can provide a component supply device and a component installation device which are smaller and can supply electronic components efficiently. Further, movement of a component supply tape associated with replenishment is performed automatically based on a driving command issued when a sensor in the component supply device or a replenishment device detects that the component supply tape runs out. The component supply device can have a more compact size particularly in a width direction than the conventional replenishment device for the component supply tape by changing holders with a holder changer.

BRIEF DESCRIPTION OF THE DRAWINGS

FIG. 1A is a left side view and FIG. 1B is a schematic front view, of a component supply device according to an embodiment of the invention;

FIGS. 4A to 4E are diagrams showing processes of the component supply device according to the embodiment of the invention, in which FIG. 4A is a schematic front view showing an initial state at the time of replenishing the component supply tape, FIG. 4B is a schematic front view showing a state when a preceding component supply tape runs out, FIG. 4C is a schematic front view showing a state at the time of replenishing the component supply tape, FIG. 4D is a schematic front view showing a state at the time of moving a reel from an upper side tape holding section to a lower side tape holding section, and FIG. 4E is a schematic front view showing a state of a reel holding section at the time of replenishing a new reel;

FIG. 9A is a schematic enlarged front view of a main part in a separator and FIG. 9B is a cross sectional view seen in a Z-Z direction in FIG. 9A, in a fifth modification of the component supply device according to the invention;

EMBODIMENTS FOR CARRYING OUT THE INVENTION

Figure 2A:
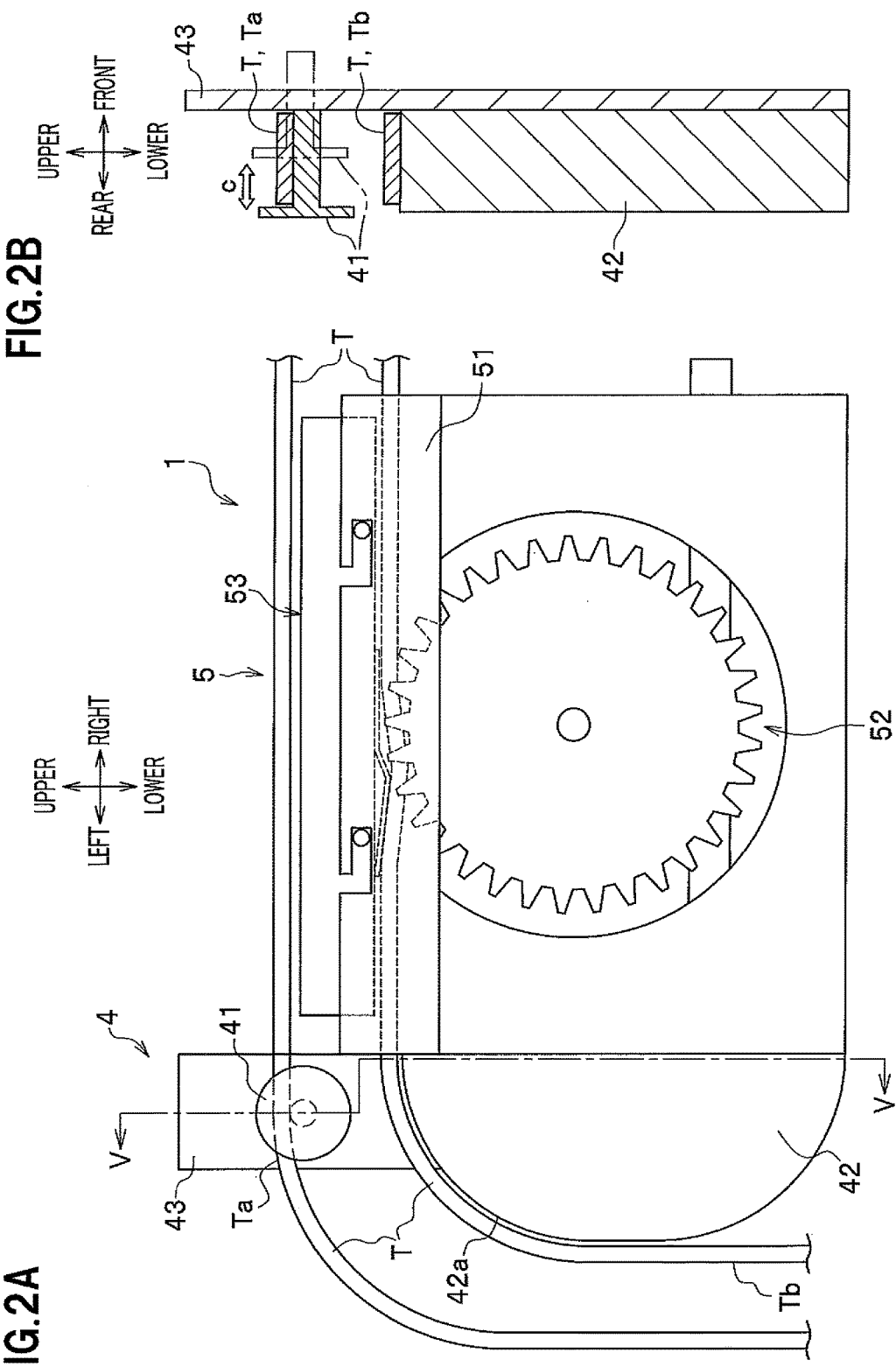
FIG. 2A is a schematic front view and FIG. 2B is a cross sectional view seen in a V-V direction in FIG. 2A, of a separator in the component supply device according to the embodiment of the invention.

A component supply device and a component installation device according to an embodiment of the invention will be explained hereinbelow. For convenience, the explanation will be made, with a front-rear side in FIG. 1A defined as a front and a rear and a right-left side in FIG. 1B defined as a right and a left.

<<Structure of the Component Supply Device>>

As shown in FIGS. 1A and 1B, a component supply device 1 is a feeder which supplies components to a component 20 installation device 7 arranged at a component feeding direction side of the component supply device 1. The component supply device 1 mainly has a replenishment device 2 and a feeding device 3 described later. The component supply devices 1 are set adjacently in a full width direction G in the component 25 installation device 7.

<<Structure of the Replenishment Device>>

As shown in FIGS. 1A and 1B, the replenishment device 2 replenishes a new component supply tape Tb to the feeding device 3 when a preceding component supply tape Ta runs out, and is provided with the feeding device 3. The replenishment device 2 has reels 20, a reel holding section 21, a separator 4 and a standby section 5. In the replenishment device 2 provided in the component supply device 1, the standby section 5 is arranged above the reel holding section 21. Therefore, in case that a reel 20 is taken out upward, the standby section 5 interferes with a component supply tape T. Further, in case that the component supply tape T in the reel holding section 21 is taken out in a front-rear direction of the device, the component supply tape T interferes with the replenishment device 2 adjacent in the front-rear direction. Therefore, the reel 20 can be detached from the left side.

<<Structure of the Component Supply Tape>>

Figure 10:
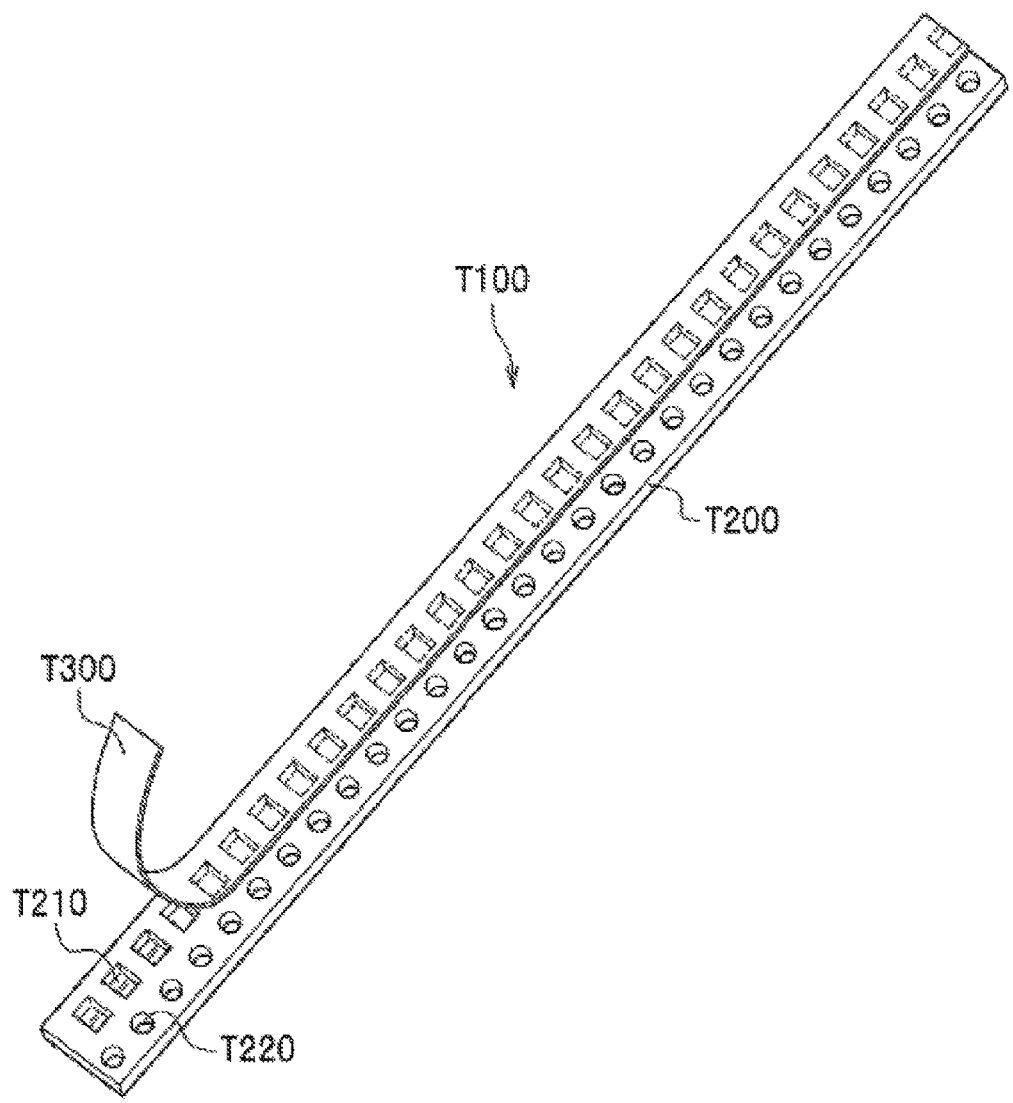
FIG. 10 is a perspective view showing a component supply tape used in a conventional component supply device.
Figure 11:
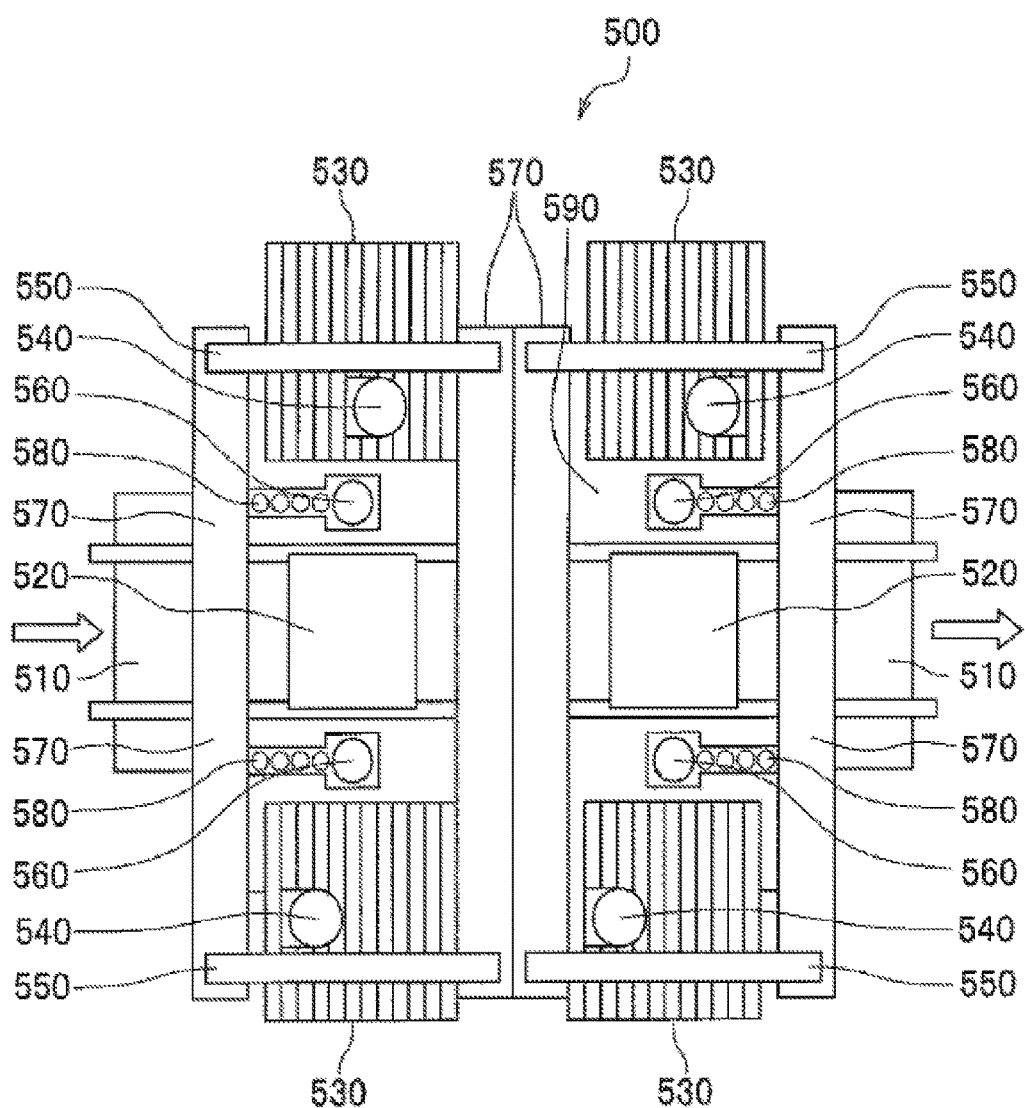
FIG. 11 is a schematic plan view showing a structure of a conventional component installation device.
Figure 12C:
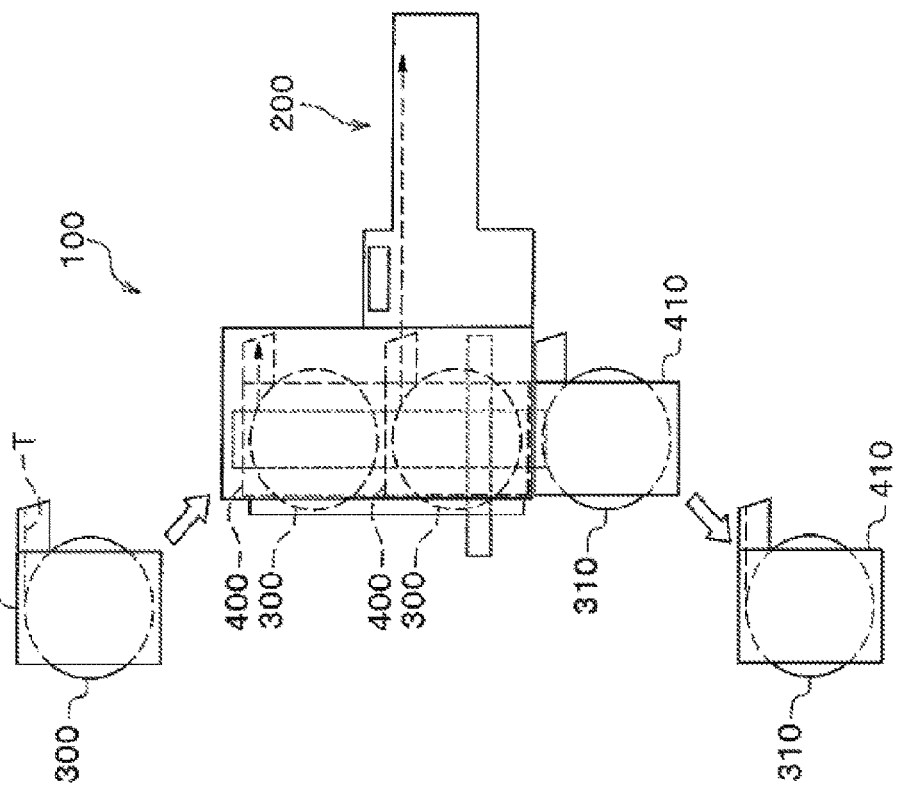
FIG. 12B is a left side view of a cassette and FIG. 12C is a front view of a main part, in an automatic replenishment device in Patent Literature 2.
Figure 12B:
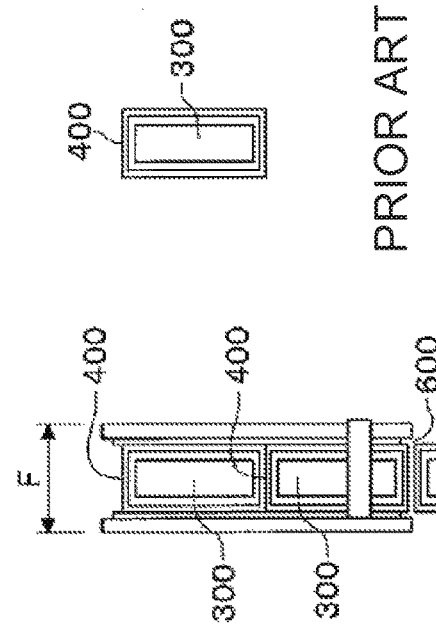
Figure 12A:
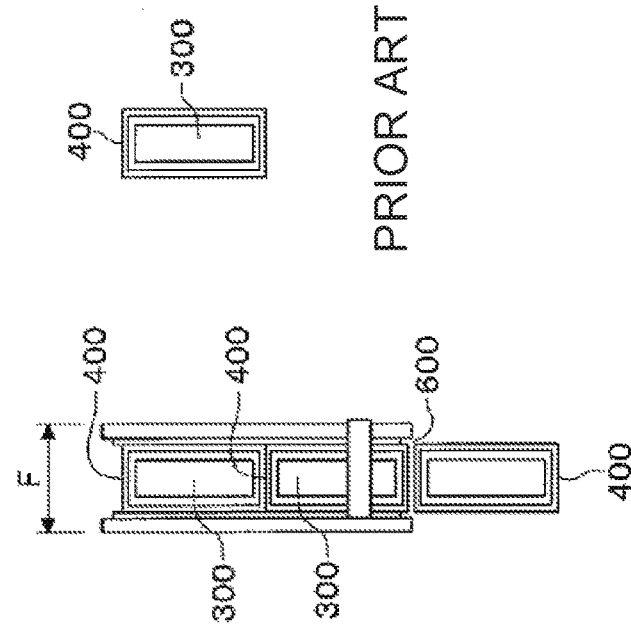
FIG. 12A is a left side view of a main part.

The component supply tape T is the same as the conventional type described above (see FIG. 10). A base end thereof is wound on the reels 20 and is arranged in the reel holding section 21 of the replenishment device 2 as a base end of a feeding path, and a tip end side thereof is arranged in the component supply device 1 via the standby section 5 described later. In other words, a tip end of the component supply tape Tb fed from the reel 20 to be replenished is set in the standby section 5. The replenished component supply tape Tb is separated in a longitudinal direction by the separator 4 from the preceding component supply tape Ta. The tip end of the replenished component supply tape Tb standbys in the standby section 5. In FIG. 1B, arrows a and b indicating the preceding component supply tape Ta and the replenished component supply tape Tb indicate respective tip ends of the component supply tapes. At the time of replenishment, the standby section 5 moves only the component supply tape T, and the reel 20 only rotates and does not move.

<<Structure of the Reel>>

As shown in FIGS. 1A and 1B, the reel 20 is a tape reel formed in a bobbin shape which winds the component supply tape T and is accommodated in the reel holding section 21. The reel 20 has a cylindrical section 20a having a hollow for a shaft wound with the component supply tape T and a disk-shaped flange sections 20b formed at both ends of the cylindrical section 20a. Two reels 20 in an up-down direction are set detachably in the box-shaped holding section 21 of which left side is open.

<<Structure of the Reel Holding Section>>

As described above, the reel holding section 21 serves to hold the reels 20, and are formed by box-shaped members in which two reels 20 are arranged in two stages in the up-down direction. The reel holding section 21 has openings 21a through which the reels 20 are inserted and removed from the left side. Further, the reel holding section 21 has a lower side tape housing 21A and an upper side tape housing 21B formed as vertically long rectangular in side view and accommodating the reels 20 sideways. The reel holding section 21 is not limited to the two stages in the up-down direction and may have stages more than two stages.

The lower side tape housing 21A and the upper side tape housing 21B have structures to accommodate the reels 20 as they are directly without any members. Therefore, the width G in the front-rear direction can be shortened to a minimum.

Structure of the Separator

Figure 2B:
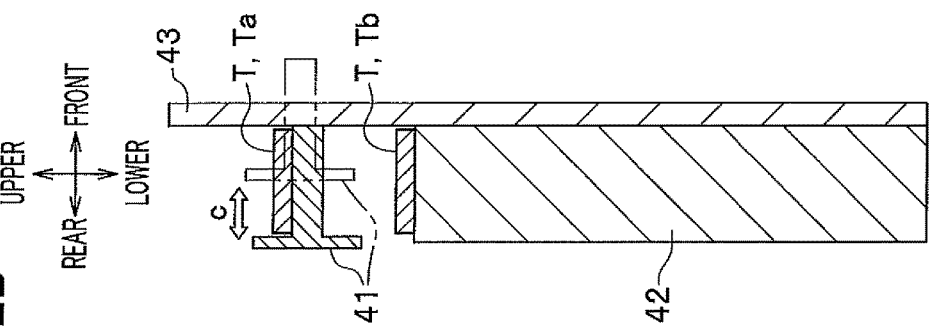

As shown in FIGS. 2A and 2B, the separator 4 splits the component supply tape T unreeled from the reels 20 in the two stages in the up-down direction which are arranged in the lower side tape housing 21A and the upper side tape housing 21B into the two stages in the up-down direction at a predetermined interval in a horizontal direction. The separator 4 mainly has an upper side tape holding section 41, a lower side tape holding section 42 and an upright plate 43, and is provided adjacent to the standby section 5.

The upper side tape holding section 41 supports the component supply tape T unreeled from the reel 20 which is arranged in the lower side tape housing 21A and guides to feed the component supply tape T to the standby section 5 horizontally. The upper side tape holding section 41 is, for example, a bobbin-shaped rotation member which is pivotally supported on the upright plate 43 in a state that the upper side tape holding section 41 can rotate freely and can move in an axial direction (arrow direction c). Therefore, when an operator changes the component supply tape T, the operator needs to move the replenished component supply tape Tb from the lower side tape holding section 42 to the upper side tape holding section 41. While, even if other replenishment device is adjacent on a lateral side, the component supply tape T can be moved by moving in the axial direction to stretch the upper side tape holding section 41.

The lower side tape holding section 42 supports the component supply tape T unreeled from the reel 20 which is arranged in the upper side tape housing 21B and guides to feed the component supply tape T to the standby section 5 horizontally. The lower side tape holding section 42 is arranged below the upper side tape holding section 41, and feeds the component supply tape T from the upper side tape housing 21B to the standby section 5 horizontally in an approximately parallel state at a predetermined interval with respect to the component supply tape T fed from the upper side tape holding section 41. The lower side tape holding section 42 is an approximately semi-circle member seen in side view and has an arc-shaped tape support face 42a seen in front view.

The upright plate 43 is a pillar-shaped plate member which supports the upper side tape holding section 41 and the lower side tape holding section 42 from a side. For example, the upright plate 43 pivotally supports the upper side tape holding section 41 in a cantilever state to be rotatable at an upper part, and sets the lower tape holding section 42 in a cantilever state at a lower part.

The upper side tape holding section 41 supports the preceding component supply tape Ta which is taken in the component supply device 1. The lower side tape holding section 42 supports the replenished component supply tape Tb. Therefore, the preceding component supply tape Ta and the replenished component supply tape Tb can be aligned in a longitudinal direction by the separator 4. This can make the full width of the separator 4 smaller. The tip end of the replenished component supply tape Tb is arranged in the standby section 5 and standbys at a lower side in the longitudinal direction with respect to the preceding component supply tape Ta.

Since the lower side tape holding section 42 and the upper side tape holding section 41 are provided in the up-down direction at a predetermined interval, the component supply tape T fed from the lower side tape housing 21A can move between the lower side tape holding section 42 and the upper side tape holding section 41.

Structure of the Standby Section

Figure 3B:
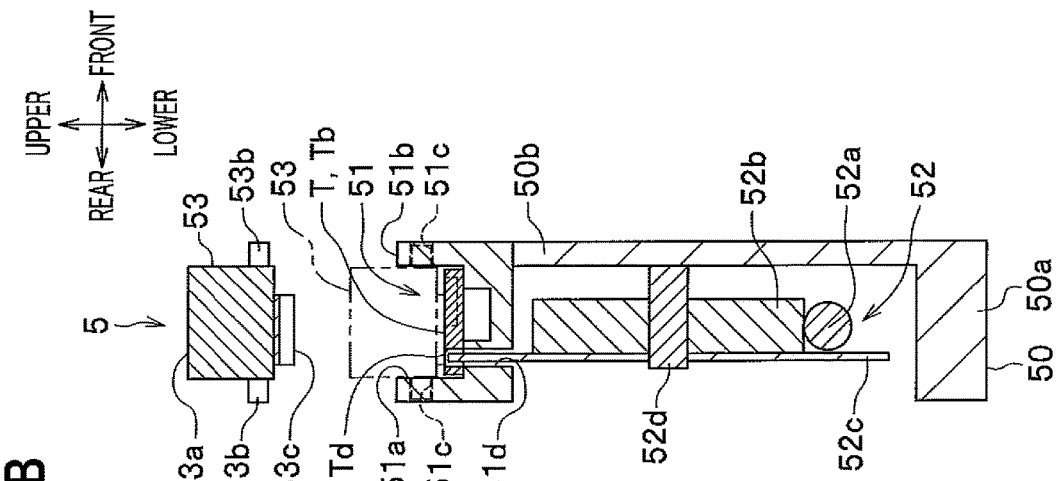
FIG. 3A is a schematic front view and FIG. 3B is a cross sectional view seen in a W-W direction in FIG. 3A, of a standby section in the component supply device according to the embodiment of the invention.
Figure 3A:
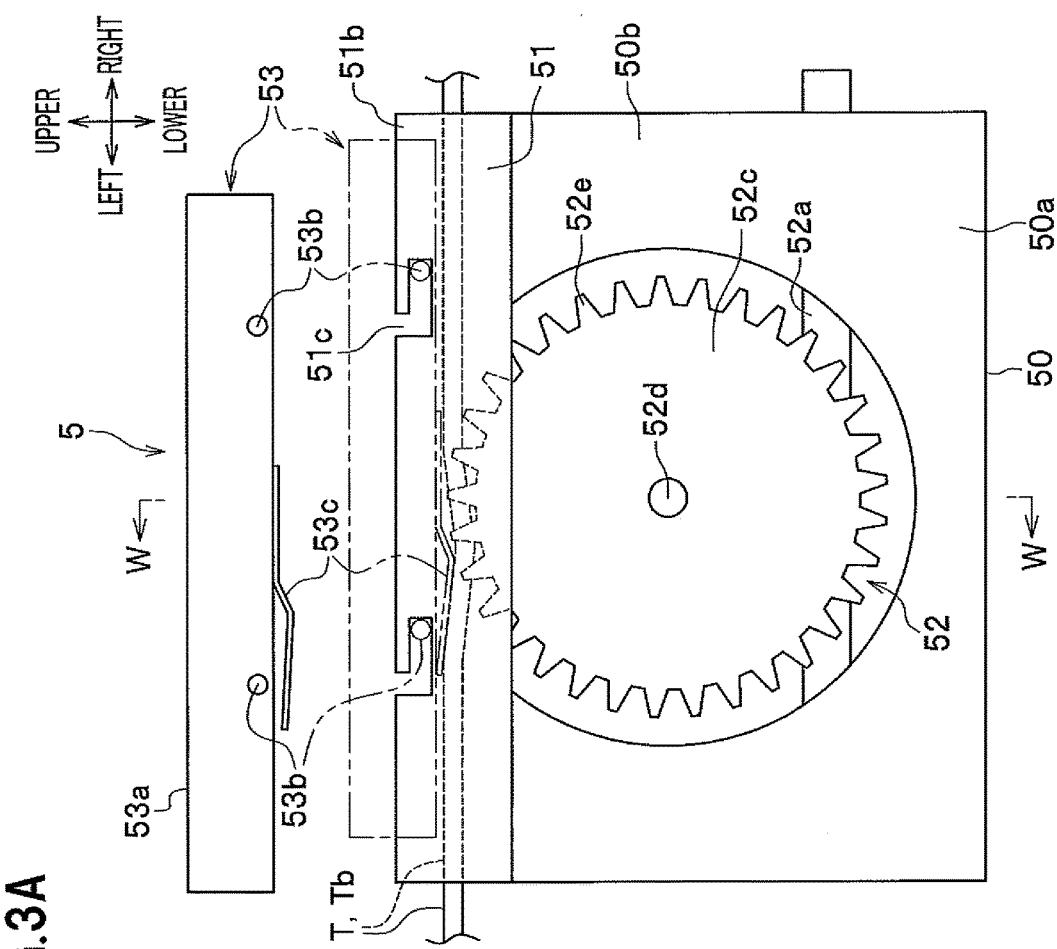

As shown in FIGS. 3A and 3B, the standby section 5 makes the replenished component supply tape Tb standby, and replenishes to feed the component supply tape Tb from the standby section 5 when a sensor S (see FIG. 1B) detects that the preceding component supply tape Ta runs out. The standby section 5 mainly has a base 50, a feeding path 51, a feeding mechanism 52 and a lid member 53.

As shown in FIG. 1B, the sensor S detects the run-out component supply tape T, and is formed by a photo interrupter or the like including a light emitter and a photo detector. The sensor S is set in the replenishment device 2 or the feeding device 3.

As shown in FIGS. 3A and 3B, the base 50 supports the whole standby section 5 and has a base section 50a which is provided horizontally at a lower end portion and a side wall 50b which is vertically arranged in the up direction.

The feeding path 51 guides the component supply tape T which moves in the feeding direction. The feeding path 51 has a guide groove 51a which is formed in an approximately concave shape in vertical cross sectional view, a pair of front and rear side walls 51b which are formed at both sides of the guide groove 51a, locking grooves 51c which are formed in the front-rear direction and the right-left direction to face the pair of side walls 51b, and a gear insertion groove 51d in which an upper end portion of a feeding gear 52c described later is inserted.

The guide groove 51a is a concave-shaped groove which extends horizontally in the feeding direction. The component supply tape T and the lid member 53 are movably engaged in the guide groove 51a. The guide groove 51a has wider width than the component supply tape T by several tenths of a millimeter.

The component supply tape T is inserted between the side walls 51b in the front-rear direction, with both right and left sides of the component supply tape T being slidable. Further, the lid member 53 is inserted such as to press the component supply tape T from above.

The pair of locking grooves 51c in the front-rear direction are L-shaped grooves in front view, in which locking pins 53b projected on an front face and a rear face of the lid member 53 are inserted to hold the lid member 53 on the feeding path 51. The lid member 53 is locked by the locking grooves 51c and the locking pins 53b such that the replenished component supply tape Tb can be detached in the up direction of the standby section 5. In this case, the lid member 53 can be separated thoroughly from the feeding path 51 by disengaging the locking pins 53b out of the locking grooves 51c. Therefore, the replenished component supply tape Tb can be detached easily.

As shown in FIGS. 3A and 3B, the gear insertion groove 51d is a slit groove in which an upper end portion of the feeding gear 52c is inserted such that teeth 52e of the feeding gear 52c engage in feed holes Td of the component supply tape T arranged on an inner bottom of the guide groove 51a.

The feeding mechanism 52 has, for example, a motor (not shown), a drive gear 52a which is rotationally driven by the motor, a transmission gear 52b which meshes with the drive gear 52a for reduced speed rotation to transmit rotation force, the feeding gear 52c which rotates with the transmission gear 52b and is arranged such that the teeth 52e engage in the feed holes Td of the component supply tape T to feed the component supply tape T, and a pivot member 52d which pivotally supports the feeding gear 52c and the transmission gear 52b.

The motor (not shown) is an electric motor having the drive gear 52a as a rotor. The drive gear 52a is, for example, a worm gear and is provided on a motor shaft. The transmission gear 52b is a worm wheel which meshes with the drive gear 52a. The feeding gear 52c is a thin gear which engages in the feed hole Td of the component supply tape T, and is, for example, a sprocket. The pivot member 52d is a shaft bar which connects the feeding gear 52c with the transmission gear 52b to be rotated integrally, and a base end thereof is fixed on the side wall 50b.

The lid member 53 covers the feeding path 51 on which the component supply tape T is arranged in the guide groove 51a from above and supports to elastically press the component supply tape T from above in the down direction. The lid member 53 has a lid member body 53a, locking pins 53b and a plate spring 53c.

The lid member body 53a is an approximately thick plate-shaped member extending in the feeding direction. The locking pins 53b are provided on a lower portion at a right and a left on the front face and the rear face, and the plate spring 53c is provided at a middle of a lower face thereof.

The locking pins 53b have a rounded bar shape to engage in the locking grooves 51c. The locking pins 53b are engaged in horizontal portions of the locking grooves 51c so that the plate spring 53c keeps pressing the component supply tape T downward.

The plate spring 53c presses the replenished component supply tape Tb from above to contact on the feeding mechanism 52 and the feeding path 51. One end of the plate spring 53c is fixed on the lower face of the lid member 53 to exert elasticity in the up-down direction.

<<Structure of the Component Exposure Device>>

The component exposure device 6 shown in FIG. 1B cuts out the cover tape which is stuck on the upper face of the component supply tape T by a cutter section (not shown) to expose the electronic components in the component housings of the carrier tape from a component takeout section 7a. The component exposure device 6 is arranged on the feeding path 51.

<<Structure of the Component Installation Device>>

The component installation device 7 has an air nozzle and the like, and sucks the exposed electronic components on the component supply tape T from the component takeout section 7a to install on the circuit board (not shown).

<<Operation>>

Next, referring mainly to FIGS. 4A to 4E, operations of the component supply device and the component installation device according to the embodiment of the invention will be explained. At first, a replenishment operation to the component supply device 1 by the replenishment device 2 will be explained.

Figure 4A:
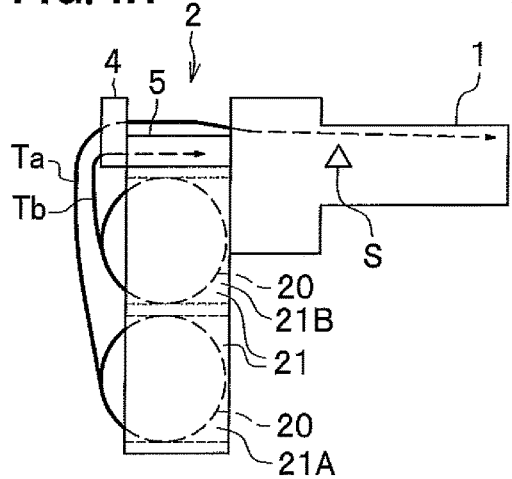

The replenishment operation for the component supply tape T proceeds from FIG. 4A to FIG. 4E described hereinbelow. As shown in FIG. 4A, in an initial state, the replenished component supply tape Tb standbys in the standby section 5 located at the lower side in the longitudinal direction with respect to the preceding component supply tape Ta. The separator 4 separates the preceding component supply tape Ta fed from the lower side tape housing 21A from the replenished component supply tape Tb fed from the upper side tape housing 21B to arrange them in the longitudinal direction.

Figure 4B:
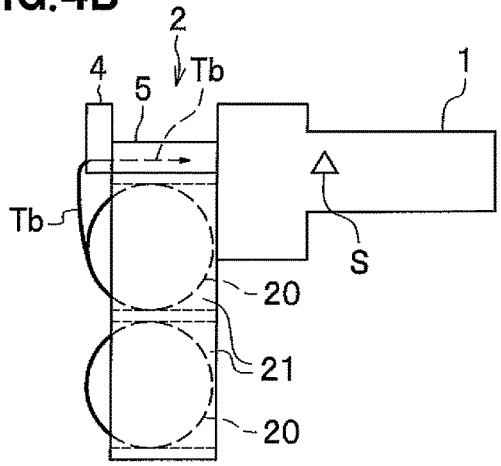

As shown in FIG. 4B, when the preceding component supply tape Ta runs out, the sensor S provided in the component supply device 1 detects the run-out of the preceding component supply tape Ta. Then, a controller (not shown) sends a drive command to the standby section 5 in the replenishment device 2, which makes the motor (not shown) rotate to drive the feeding mechanism 52 (see FIG. 2A).

Figure 4C:
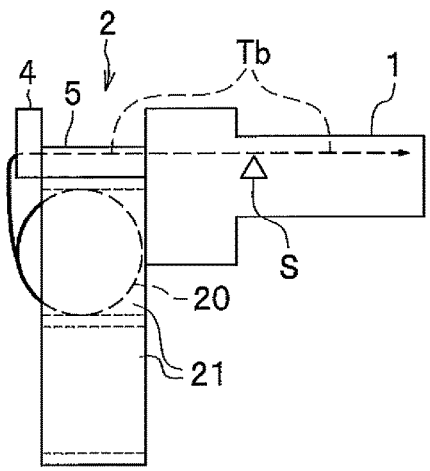

As shown in FIG. 4C, the feeding mechanism 52 drives to move the replenished component supply tape Tb from the standby section 5 to the component supply device 1 to replenish the component supply tape T. After the component supply tape T is replenished, the operator takes out the empty reel 20 (reel 20 on which the preceding component supply tape Ta was wound) from a lower stage in the reel holding section 21.

Figure 4D:
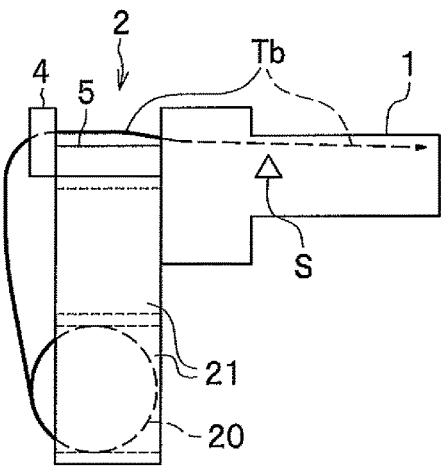

As shown in FIG. 4D, the operator removes the component supply tape Tb replenished from the standby section 5 while changing a setting position of the reel 20 wound with the replenished component supply tape Tb from the upper side tape housing 21B to the lower side tape housing 21A of the separator 4. Thus, the component supply tape Tb is moved to an upward space of the standby section 5, and the reel 20 wound with the replenished component supply tape Tb is moved from the upper stage to the lower stage in the reel holding section 21.

Figure 4E:
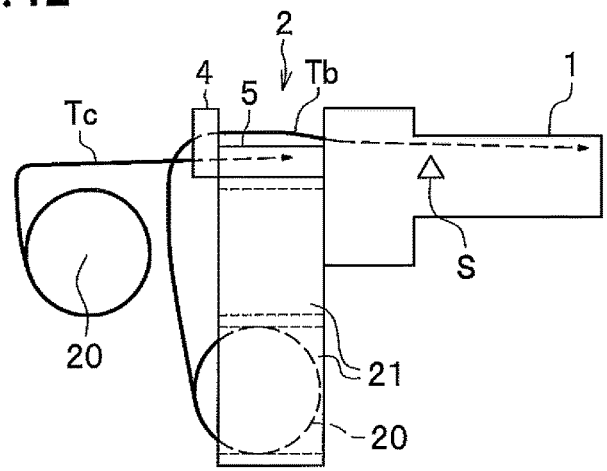

As shown in FIG. 4E, a newly prepared replenished component supply tape Tc is inserted in the standby section 5 and the reel 20 wound with the replenished tape Tb is set in the lower side tape housing 21A of the separator 4. Thus, the newly prepared reel 20 wound with the component supply tape T is inserted in the upper side tape housing 21B of the reel holding section 21, which leads to the initial state shown in FIG. 4A.

Since the change operation or the replacement operation of the reels 20 is performed after the replenished component supply tape Tb is replenished in the component supply device 1, the component installation device 7 is not stopped due to the operation. In other words, the change operation for the reels 20 is not necessarily in synchronization with the replenishment timing of the component supply tape T and the operator may perform the operation at an arbitrary convenient time. It is noted that the operation needs to be done between a brand new state and the run-out state of the preceding replenished component supply tape Tb.

Thus, when the component supply tape T is replenished, the replenishment device 2 moves only the replenished component supply tape Tb. Therefore, members and the like for moving members other than the component supply tape T are not necessary, which simplifies a structure of the replenishment device 2 as the members and the like are omitted. As a result, the full width of the whole device can be narrower.

Further, the replenished component supply tape Tb standbys in the standby section 5 at the lower side of the preceding component supply tape Ta in the longitudinal direction. When the preceding component supply tape Ta runs out and the motor (not shown) provides power to a drive system of the feeding mechanism 52 in the standby section 5 based on a run-out detection signal from the sensor S, the feeding mechanism 52 can move the replenished component supply tape Tb to the component supply device 1 smoothly.

Still further, the width of the component supply tape T is formed narrower than that of the reel 20 to be wound with the component supply tape T, and the reel 20 itself can be inserted in the reel holding section 21. Therefore, the component supply device 1 can have a smaller size, especially in the width direction (front-rear direction) compared with a device in which a component supply tape is replenished by changing conventional holders with a holder changer.

First Modification

The invention is explained based on the embodiment, but the invention is not limited to the structures described in the embodiment and the structures can be modified appropriately without departing from the scope of the invention, including combination and selection of the structures described in the embodiment. The structures explained above will be labeled with the same numerals and the explanations thereof will be omitted.

Figure 5:
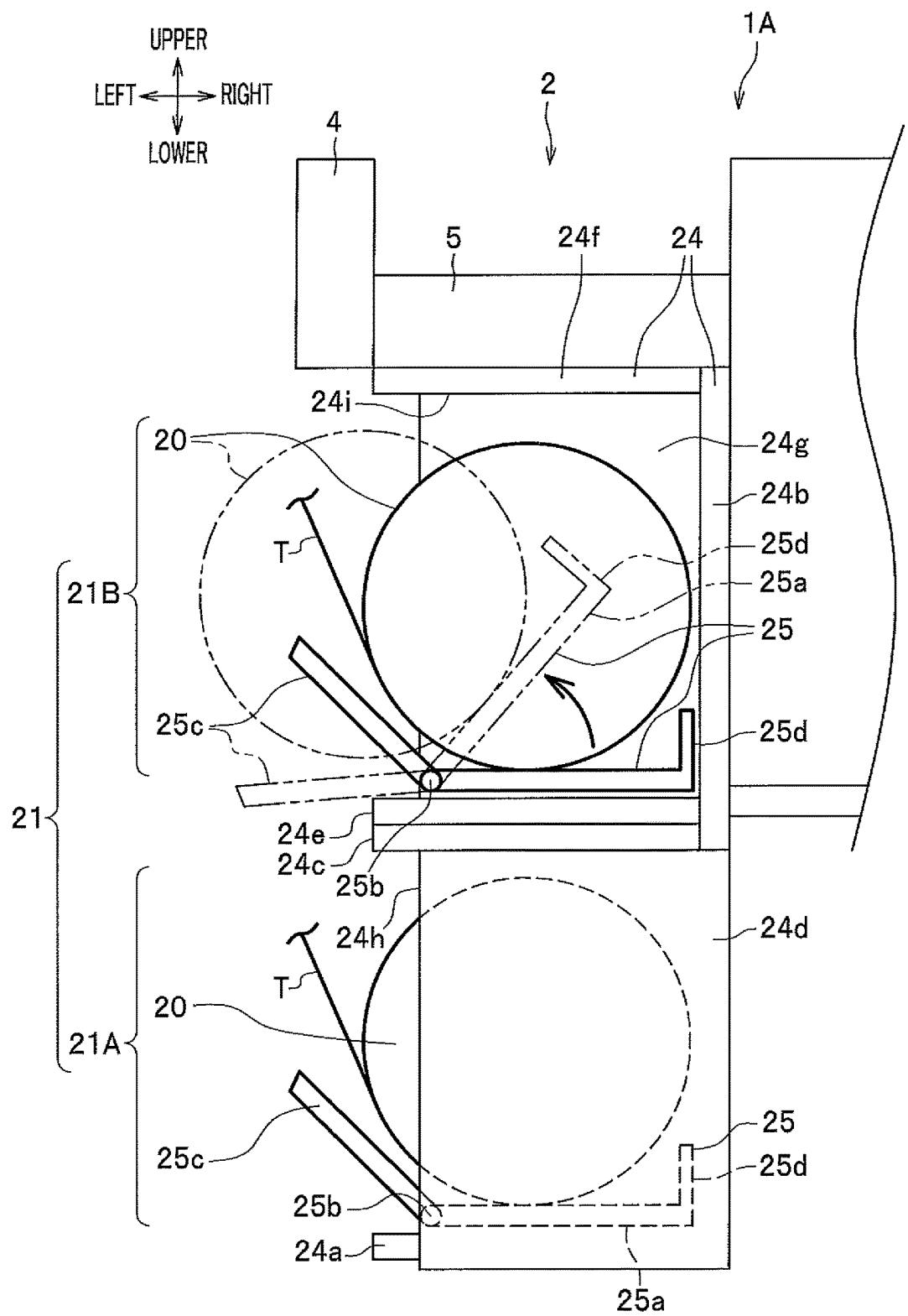
FIG. 5 is an enlarged side view of a main part in the reel holding section in a first modification of the component supply device according to the invention.

FIG. 5 is a schematically enlarged side view of a main part in the reel holding section, showing a first modification of the component supply device according to the invention.

As shown in FIG. 5, the reel holding section 21 of a component supply device 1A has levers 25c and trays 25. The levers 25c and the trays 25 may be a rotational tray type where the levers 25c and the trays 25 rotate on a tray rotation support section 25b as a fulcrum.

In this case, the reel holding section 21 mainly has a support case 24 and the trays 25 having the levers 25c in the support case 24.

The reel holding section 21 has a length in the right-left direction where the reels can be barely accommodated, which results in no other members between the reels 20 and the reel holding section 21. Therefore, the reel holding section 21 has the narrower full width (length in the front-rear direction) thereof to make the whole replenishment device 2 smaller. The reel holding section 21 has the lower side tape housing 21A arranged in a lower stage side and the upper side tape housing 21B arranged thereon to form a multistage (two stages), which enables the reels 20 to be arranged in the two stages in the up-down direction.

The support case 24 is a member for forming an outer housing of the reel holding section 21, and has functions as a support member for supporting a lower side of the standby section 5 and as a plate member forming upper faces, rear faces, bottom faces, side faces and openings of the box-shaped lower side tape housing 21A and the upper side tape housing 21B constituting the two stage in the up-down direction.

The support case 24 has a bottom face member 24a, a rear face member 24b, an upper face member 24c, a side plate member 24d, a bottom face member 24e, an upper face member 24f, a side plate member 24g and openings 24h, 24i described later.

The bottom face member 24a is a bottom plate member which forms a bottom face of the lower side tape housing 21A and the tray 25 is placed thereon.

The rear member 24b is a plate member which supports the standby section 5 and forms rear faces of the lower side tape housing 21A and the upper side tape housing 21B. The rear face member 24b is arranged between a right side (rear side) end of the bottom face member 24a and a right side (rear side) end of the standby section 5.

The upper face member 24c is a plate member which forms an upper face of the lower side tape housing 21A.

The side plate member 24d is a pair of front and rear plate members which form side faces of the lower side tape housing 21A.

The bottom face member 24e is a plate member which forms a bottom face of the upper side tape housing 21B.

The upper face member 24f is a plate member which supports the lower side of the standby section 5 and forms an upper face of the upper side tape housing 21B.

The side plate member 24g is a pair of front and rear members which form side faces of the upper side tape housing 21B.

The openings 24h, 24i are formed through which the reels 20 are inserted and removed at the left side of the lower side tape housing 21A and the upper side tape housing 21B.

The trays 25 are members on which the reels 20 are placed, and are rotatably provided in the lower side tape housing 21A and the upper side tape housing 21B, respectively. Since the trays 25 arranged in the lower side tape housing 21A and the upper side tape housing 21B have the same shape, one of them will be appropriately explained and the other is labeled with the same numerals and the explanation thereof will be omitted.

Each tray 25 has a placing section 25a on which the reel 20 is placed, the tray rotation support section 25b arranged at the opening 24h, 24i side of the placing section 25a, a lever 25c extending from the tray rotation support section 25b outwardly, and a stopper 25d formed to bend upward from an end of a deep side of the placing section 25a.

As shown by imaginary lines in the upper side tape housing 21B in FIG. 5, when the levers 25c are operated in the up-down direction, the placing sections 25a are provided in the lower side tape housing 21A and the upper side tape housing 21B such that the placing sections 25a rotate with the levers 25c in the up-down direction around the tray rotation support sections 25b.

The tray rotation support sections 25b are shaft members which rotatably arrange the trays 25 in the lower side tape housing 21A and the upper side tape housing 25b, and are provided on the bottom face in the openings 24h, 24i on the bottom face members 24a, 24e.

The lever 25c is operated to rotate the tray 25 when the reel 20 is placed on the placing section 25a and the reel 20 is taken out from the placing section 25a. The lever 25c is rotatably arranged in the up-down direction around the tray rotation support section 25b. The lever 25c is formed to bend at an obtuse angle with respect to the placing section 25a around the tray rotation support section 25b.

When the reels 20 are placed on or taken out from the placing sections 25a, the levers 25c are operated downward and are put into a horizontal state from a state being arranged diagonally in front of the openings 24h, 24i. With this operation, the placing sections 25a rotate upward around the tray rotation support sections 25b to push the reels 20 outside the openings 24h, 24i. Therefore, the reels 20 can be inserted into and ejected from the lower side tape housing 21A and the upper side tape housing 21B easily.

The stoppers 25d are projection pieces which prevent the reels 20 placed on the placing sections 25a from moving to deeper sides of the lower side tape housing 21A and the upper side tape housing 21B beyond the placing sections 25a. The stopper 25d is integrally formed with an end portion of the placing section 25a. When the lever 25c is operated, the stopper 25d rotates with the placing section 25b around the tray rotation support section 25b.

Thus, the rotatable trays 25 with the levers 25b are arranged in the lower side tape housing 21A and the upper side tape housing 21B. Therefore, when the operator pushes down the levers 25c, the whole trays 25 rotate around the tray rotation support section 25b. Then, as shown by imaginary lines, the levers 25c are in the horizontal state from the state being in front of the openings 24h, 24i, and the placing sections 25a push the placed reels 20 toward outside the openings 24h, 24i, by which the reels 20 can be detached easily.

Further, as shown by solid lines in FIG. 5, when the operator pushes up the levers 25c, the whole trays 25 rotate around the tray rotation support section 25b, and then, the levers 25c move toward the front sides of the openings 24h, 24i. Therefore, the reels 20 placed on the placing sections 25a can be prevented from falling off from the lower side tape housing 21A and the upper side tape housing 21B. Still further, the placing sections 25a are in the horizontal state to contact on upper faces of the bottom face members 24a, 24e and the horizontal state is maintained by the weight of the reels 20 at that time. Thus, the placing sections 25a are arranged rotatably. Therefore, the reels 20 can be stably placed on the placing sections 25a of the lower side tape housing 21A and the upper side tape housing 21B.

Second Modification

Figure 6:
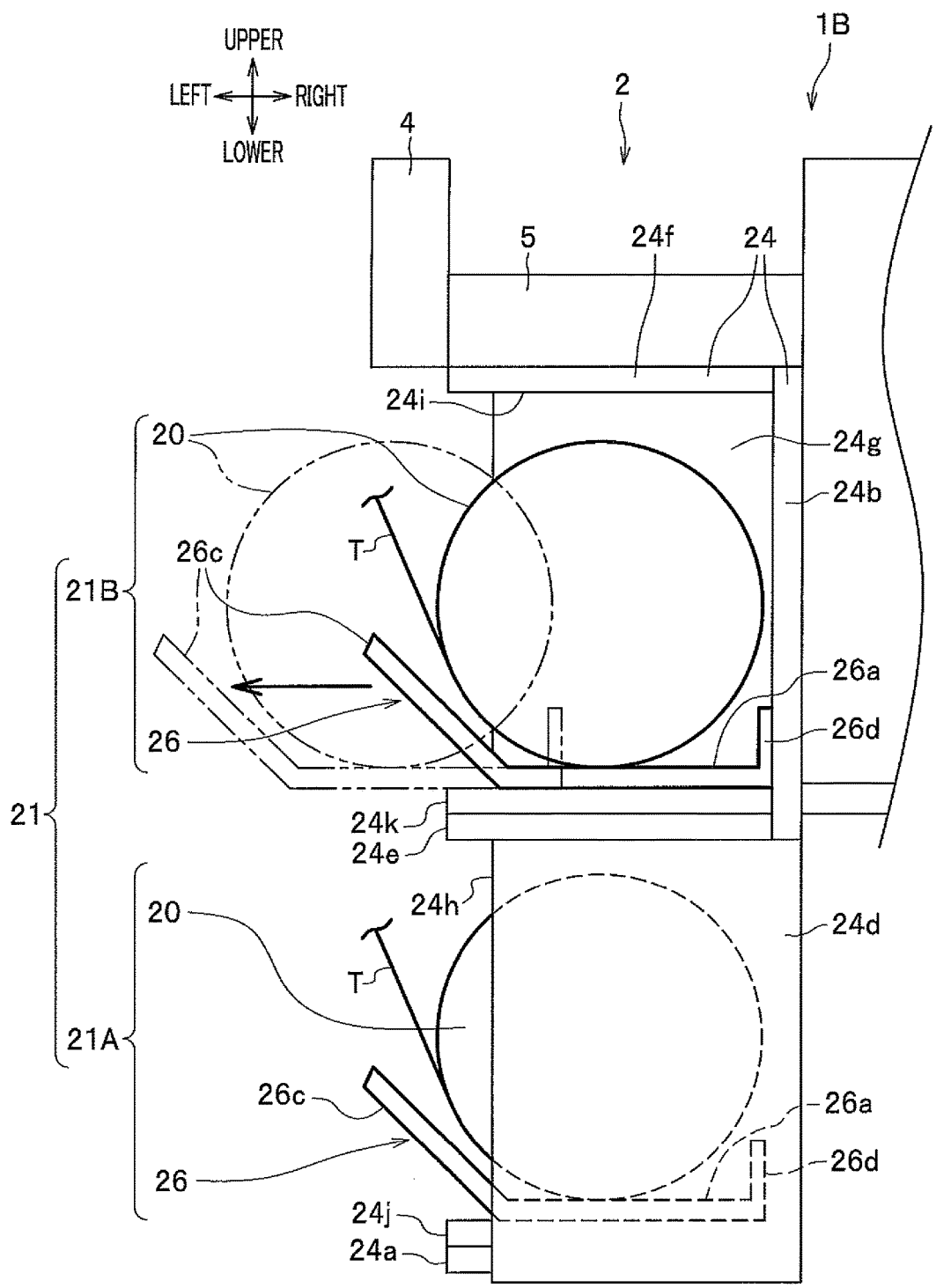
FIG. 6 is an enlarged side view of the main part in the reel holding section in a second modification of the component supply device according to the invention.

FIG. 6 is a schematically enlarged side view of a main part in the reel holding section showing a second modification of the component supply device according to the invention.

As a component supply device 1B shown in FIG. 6, the reel holding section 21 explained in the aforementioned embodiment may be such that trays 26 can slide in and out from the lower side tape housing 21A and the upper side tape housing 21B freely by sliding in the horizontal direction.

In this case, each tray 26 is integrally formed with a placing section 26a on which the reel 20 is placed, a lever 26c which is connected consecutively to the placing section 26a at each opening 24h, 24i side of the placing section 26a, and a stopper 26d which is formed to bend upward from an end portion at a deep side of the placing section 26a. Bottom faces of the placing sections 26a are preferably formed smoothly with respect to tray sliders 24j, 24k arranged below the bottom faces.

The levers 26c are holding members which are held by the operator when the trays 26 are pulled out from or pushed in the lower side tape housing 21A and the upper side tape housing 21B. The levers 26c are formed to bend at an obtuse angle with respect to the placing sections 26a in side view and further function to prevent the reels 20 placed on the placing sections 26a from falling off from the placing sections 26a to outside the openings 24h, 24i.

The reel holding section 21 may have the same structure as the reel holding section 21 in the first modification described above or a structure in which the tray sliders 24j, 24k are arranged on the bottom faces of the trays 26. The tray sliders 24j, 24k are plate members on which the trays 26 are placed, and are provided on the bottom face members 24a, 24e. In this case, as shown in FIG. 6, the tray sliders 24j, 24k may be fixed on the bottom face members 24a, 24e, or may slide together with the trays 26 on the bottom face members 24a, 24e.

Thus, the reel holding section 21 has the slide type trays 26 which can be slid in and out freely. When the operator pulls out the tray 26, as shown by the imaginary line in FIG. 6, the reel 20 can be placed easily on the tray 26 as the tray 26 is pulled out.

Further, as shown by solid lines in FIG. 6, when the operator pushes the trays 26 in the lower side tape housing 21A and the upper side tape housing 21B, the component supply tape T wound on the reels 20 may be pulled and unreeled. In this situation, the levers 26c are arranged at the front sides of the openings 24h, 24i to prevent the reels 20 from falling off from the trays 26, which improves operation efficiency.

Third Modification

Figure 7A:
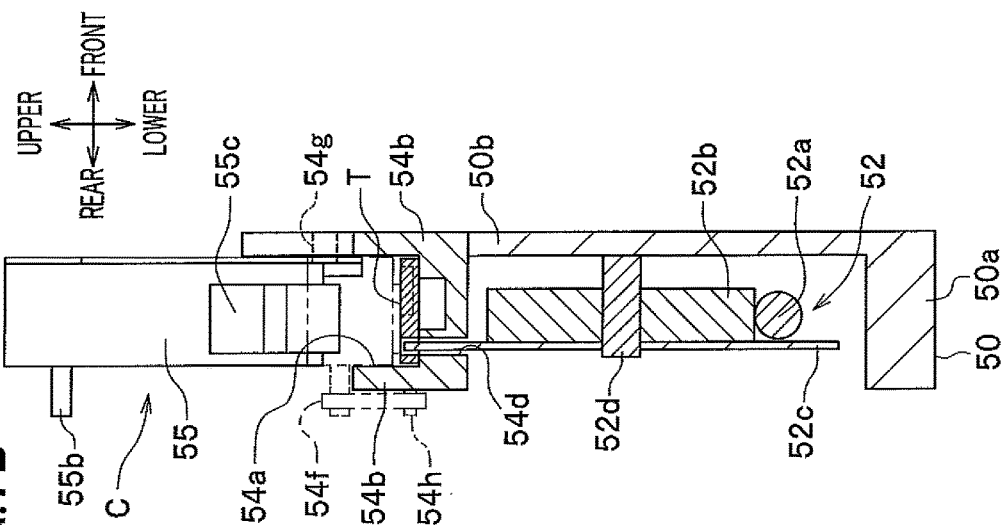
FIG. 7A is a schematic enlarged side view of a main part in a standby section and FIG. 7B is a cross sectional view seen in an X-X direction in FIG. 7A, in a third modification of the component supply device according to the invention.
Figure 7B:
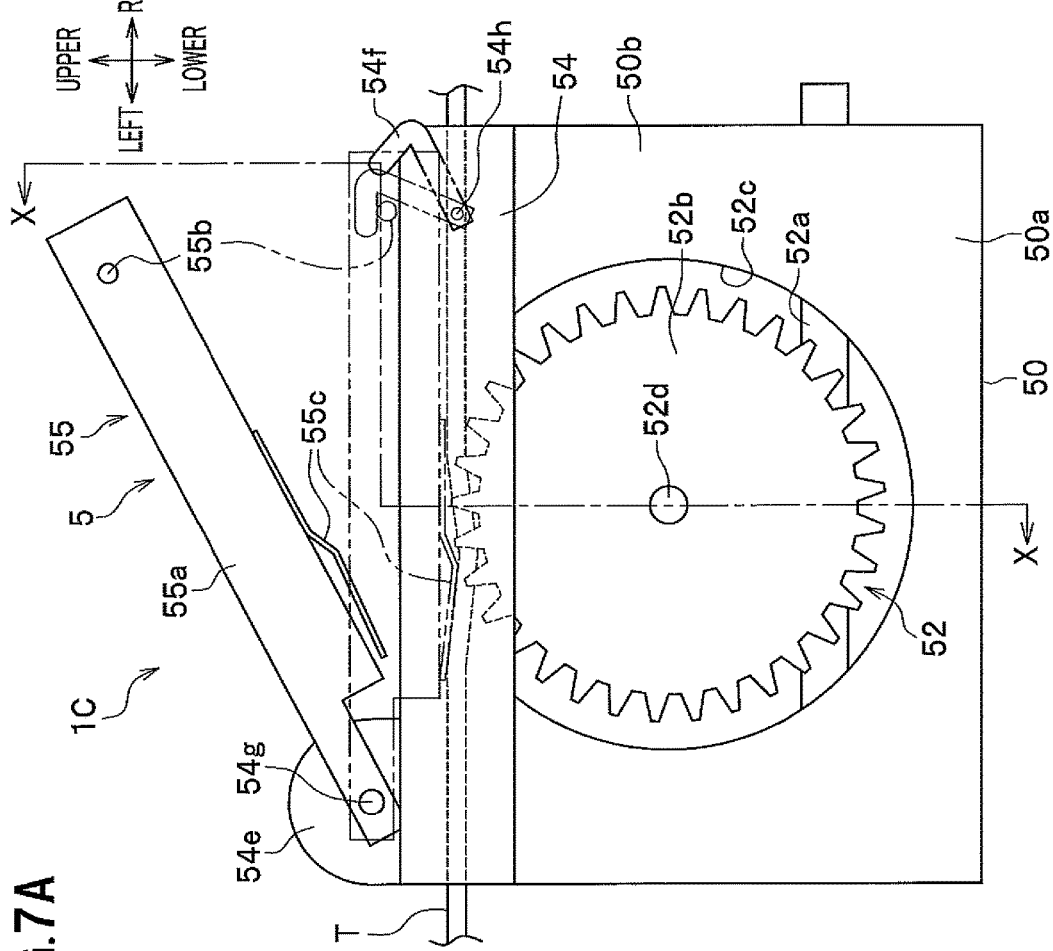

FIG. 7A is a schematically enlarged side view of a main part in the standby section and FIG. 7B is a cross sectional view in an X-X direction in FIG. 7A, of a third modification of the component supply device according to the invention.

The lid member 53 (see FIGS. 3A and 3B) of the standby section 5 in the component supply device 1 explained in the above embodiment may be pivotally supported to be rotatable in the up-down direction with respect to the feeding path 54, as a lid member 55 of a component supply device IC shown in FIGS. 7A and 7B.

In this case, the feeding path 54 mainly has a guide groove 54a, side walls 54b, a gear insertion groove 54d, a pivotally supporting piece 54e, a lock member 54f and a pivotally supporting member 54g.

The guide groove 54a is formed approximately in a concave shape in side view as that in the above embodiment.

For example, the lock member 54f is arranged on one side (side wall at a rear side) and the pivotally supporting piece 54e is provided on the other side (side wall at a front side) of the pair of side walls 54b.

The gear insertion groove 54d has the same structure as the gear insertion groove 51d in the above embodiment.

As shown in FIGS. 7A and 7B, the pivotally supporting piece 54e is a plate-shaped member having the pivotally supporting member 54g which pivotally supports a left end portion of the lid member 55 rotatably in the up-down direction. The pivotally supporting piece 54e projects upward from an upper end of a left end portion of the side wall 54b.

The lock member 54f is a hook-shaped member which engages with the lock pin 55b to cover the guide groove 54a with the lid member 55 while a plate spring 55c is being pressed on the component supply tape T. The lock member 54f is an approximately L-shaped member in front view and of which base end is pivotally supported by a supporting shaft 54h on the side wall 54b rotatably.

The lid member 55 mainly has a lid member body 55a, the locking pin 55b and the plate spring 55c as the lid member 53 in the above embodiment.

A left end portion of the lid member body 55a is rotatably arranged on the feeding path 54 in the up-down direction by the pivotally supporting member 54g.

The locking pin 55b projects at a front face of a right end portion of the lid member body 55a.

The plate spring 55c is provided at a position slightly near the pivotally supporting member 54g on a bottom face of the lid member body 55a, and can press the component supply tape Tb around the pivotally supporting member 54g.

Thus, as to the standby section 5, the lid member 55 can be rotated around the pivotally supporting member 54g in the up-down direction with respect to the feeding path 54. Therefore, the replenished component supply tape Tb arranged between the feeding path 54 and the lid member 55 can be detached from the standby section 5.

The lid member 55 may have various forms such as an opening/closing type as shown in FIG. 7A, a completely separation type as the lid member 53 (see FIG. 3) in the above embodiment, and the like. In either case, it is essential to have a structure only with the side walls 54b of the feeding path 54 on the side faces of the component supply tape T. Thus, the full width of the standby section 5 is shortened and the whole standby section 5 can be smaller.

Fourth Modification

Figure 8B:
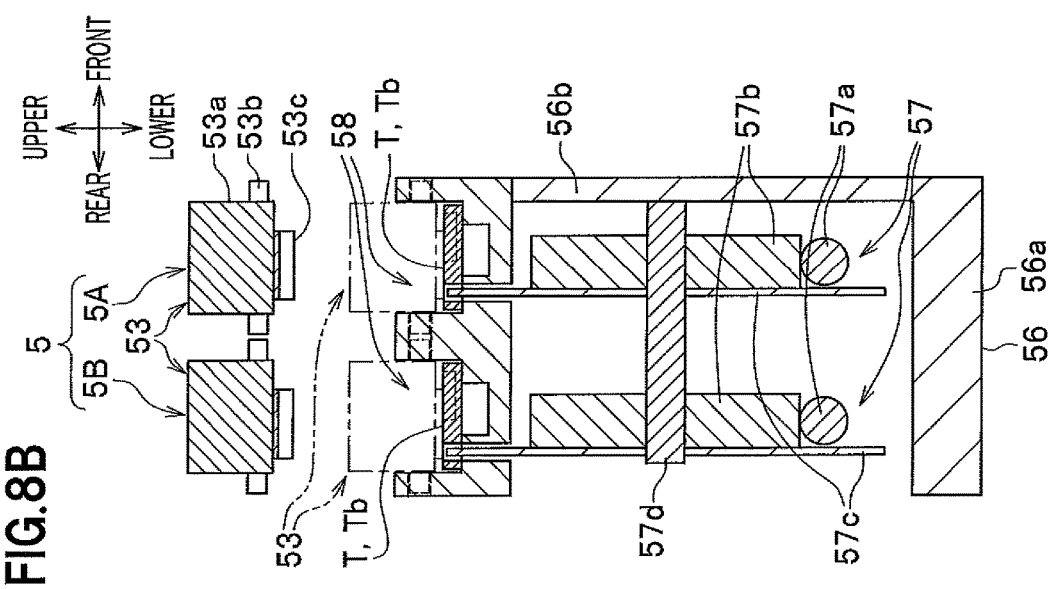
FIG. 8A is a schematic enlarged side view of the main part in the standby section and FIG. 8B is a cross sectional view seen in a Y-Y direction in FIG. 8A, in a fourth modification of the component supply device according to the invention.
Figure 8A:
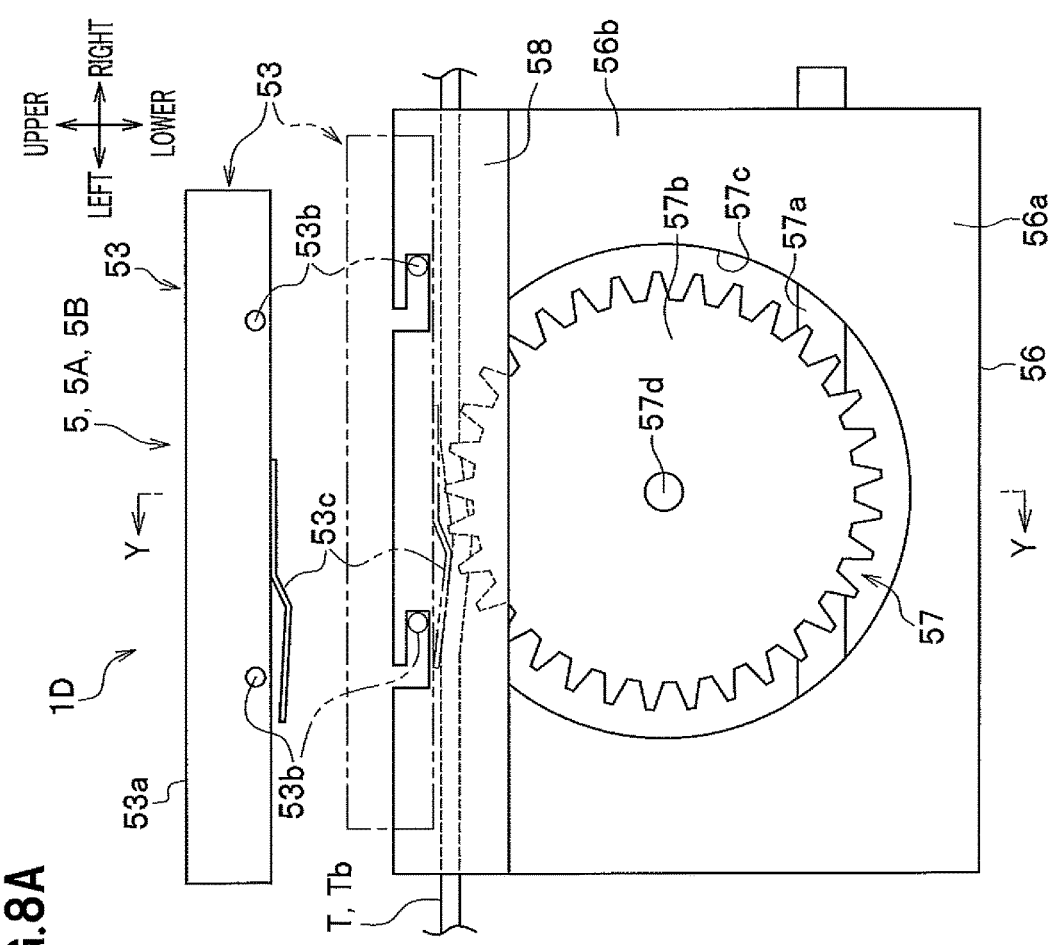

FIG. 8A is a schematically enlarged side view of the main part in the standby section and FIG. 8B is a cross sectional view in a Y-Y direction in FIG. 8A, of a fourth modification of the component supply device according to the invention.

The standby section 5 of the component supply device 1 explained in the above embodiment may have a structure of a component supply device 1D shown in FIGS. 8A and 8B, in which two standby sections 5A, 5B are arranged adjacently in the front-rear direction in an integral form.

In this case, a base 56, a pivotally supporting member 57d of the feeding mechanisms 57 and feeding paths 58 are formed to have respective lengths in the front-rear direction corresponding to respective lengths of the two standby sections 5A, 5B in the front-rear direction.

In other words, the base 56 is formed such that the length of the base section 56a in the front-rear direction is about twice as long as the base section 50a (see FIG. 3) in the above embodiment.

The pivotally supporting member 57d in the front-rear direction is formed about twice as long as the pivotally supporting member 52d (see FIG. 3) in the above embodiment to support two transmission gears 57b and two feeding gears 57c on the side wall 56b.

Further, the feeding paths 58 have two guide grooves 58a in which two component supply tapes T can be engaged with the two standby sections 5A, 5B movably. The feeding paths 58 are formed twice as long as the feeding path 51 (see FIG. 3) in the above embodiment in the front-rear direction.

Thus, the component supply device 1D with the plurality of integral standby sections 5 has the two standby sections 5A, 5B side by side in an integrated form. Therefore, the two replenished component supply tape Tb are on standby and the two component supply tapes T can be supplied to the component installation device 7 simultaneously. Thus, the invention can be applied to a dual type component supply device which supplies two kinds of tapes by itself.

To prevent the component supply device 7 from stopping due to the run-out, two replenished component supply tapes Tb need to be replenished for each tape type.

Fifth Modification

FIG. 9A is a schematically enlarged front view of a main part in the separator and FIG. 9B is a cross sectional view in a Z-Z direction in FIG. 9A, of a fifth modification of the component supply device according to the invention.

The separator 4 of the component supply device 1 explained in the above embodiment may have a structure of a component supply device 1E shown in FIGS. 9A and 9B, in which two separators 4A, 4B are arranged adjacently in the front-rear direction in an integral form.

In this case, a component supply device 1E has the mutually adjacent two separators 4A, 4B to be integrated, and the device having the integrated two standby sections 5A, 5B explained in the fourth modification is used correspondingly. The separators 4A, 4B are formed such that two separators 4 (see FIG. 2) explained in the above embodiment use the upright plate 43 in common, and are formed symmetrically in the front-rear direction centered on the upright plate 43.

Accordingly, the two component supply devices 1E are provided in a narrow space by integrating the two separators 4A, 4B. Therefore, the supply efficiency of the electronic components can be doubled and component supply time can be reduced in half. Further, the one upright plate 43 is used by the two separators 4A, 4B, and the width of the whole device in the front-rear direction can be narrower to make the whole device smaller as the upright plate 43 is shared.

Other Modification

In the standby sections (see FIGS. 3, 7 and 8) explained in the above embodiment, the third modification and the fourth modification, when the preceding component supply tape Ta runs out, driving force is transmitted from a driving force transmission system to the feeding mechanism 52 for the component supply tape T and the component supply tape T is moved to the component supply device 1. However, since feeding resistance due to friction and the like of the component supply tape T is uneven, moving speed varies.

Further, in case that the movement speed of the replenishment device 2 is faster than reception speed of the component supply device 1, a redundancy portion of the component supply tape T may deform such as buckling or the like due to speed difference. On the other hand, in case that the movement speed of the replenishment device 2 is slower than the reception speed of the component supply device 1, tension is applied on the component supply tape T between the component supply device 1 and the replenishment device 2 due to the speed difference.

To solve such problems, a one-way clutch is provided in the feeding mechanism 52 of the standby section 5. This can restrain the deformation of the component supply tape T and the application of tension on the component supply tape T even the movement speed of the replenishment device 2 varies. In this case, it is effective that the speed difference is set such that the reception speed of the component supply device 1 is always faster than the feeding speed of the component supply tape T.

Further, as other way to solve the problems, the speed is controlled such that the movement speed of the replenishment device 2 is equivalent to the reception speed of the component supply device 1.

EXPLANATION OF REFERENCES 1 component supply device
2 replenishment device
3 feeding device
4 separator
5 standby section
6 component exposure device
7 component installation device
7a component takeout section
20 reel
21 reel holding section
21a opening
21A lower side tape housing (tape housing)
21B upper side tape housing (tape housing)
25, 26 tray
25c, 26c lever
51 feeding path
51a guide groove
52 feeding mechanism
53 lid member
S sensor
T component supply tape
Ta preceding component supply tape
Tb replenished component supply tape
Tc new component supply tape

What is claimed is:

1. A component supply device that mounts a component supply tape and exposes an electronic component from the component supply tape to supply the electronic component to a component installation device that mounts the electronic component on a circuit board, the component supply device comprising:

a replenishment device that replenishes a new component supply tape when a preceding component supply tape runs out;

a feeding device that feeds the new component supply tape replenished by the replenishment device; and a sensor that detects run-out of the preceding component supply tape, wherein the replenishment device has a reel holding section on which a first reel wound with the preceding component supply tape and a second reel wound with the new component supply tape are inserted, and a standby section that makes the new component supply tape standby in a state of being wound on the second reel, the standby section has a feeding mechanism that feeds the new component supply tape unreeled from the second reel, a base for supporting the feeding mechanism, and a controller that controls and drives the feeding mechanism, the feeding mechanism has a feeding gear, the feeding gear is disposed at a position where the feeding gear is engaged with the new component supply tape wound on the second reel, the feeding gear rotates about a pivot member fixed to the base, the standby section has a partition that covers a first feeding path for feeding the new component supply tape from the reel holding section to the installation device, the partition separates the first feeding path from a second feeding path for feeding the preceding component supply tape to the installation device, the feeding gear is provided on the first feeding path and engaged with the new component supply tape, the partition and the feeding gear are arranged to face each other across the new component supply tape, and the controller is operable, when the sensor detects the run-out of the preceding component supply tape and generates a detection signal, to drive the feeding gear to allow the new component supply tape to be moved from the standby section to the installation device, as a control of replenishing the new component supply tape.

2. The component supply device according to claim 1, wherein the replenishment device has a separator that separates the preceding component supply tape from the new component supply tape in addition to the reel holding section and the standby section, and the new component supply tape stands by at the standby section displaced in a longitudinal direction with respect to the preceding component supply tape in the replenishment device.

3. The component supply device according to claim 2, wherein the first feeding path is formed to have a width of the new component supply tape and has a guide groove in which the new component supply tape is movably inserted; and the partition is a lid member that is arranged on the guide groove having the new component supply tape therein; and wherein the lid member is detachably provided on the first feeding path.

4. The component supply device according to claim 1, wherein the reel holding section has a box-shaped tape housing that is arranged in a plurality of stages in an up-down direction and has an opening that opens in a lateral direction, and the tape housing includes a tray that is rotatably or slidably arranged therein and on which the reel is placed, and a lever that rotates or slides the tray.

5. The component supply device according to claim 2, wherein the reel holding section has a box-shaped tape housing that is arranged in a plurality of stages in an up-down direction and has an opening that opens in a lateral direction, and the tape housing includes a tray that is rotatably or slidably arranged therein and on which the reel is placed, and a lever that rotates or slides the tray.

6. The component supply device according to claim 1, wherein the first feeding path is formed to have a width of the new component supply tape and has a guide groove in which the new component supply tape is movably inserted; and the partition is a lid member that is arranged on the guide groove having the new component supply tape therein; and wherein the lid member is detachably provided on the first feeding path.

7. The component supply device according to claim 6, wherein the feeding mechanism has a one-way clutch to rotationally drive the feeding mechanism such that movement speed of the new component supply tape by the feeding mechanism is slower than reception speed of the component supply device.

8. The component supply device according to claim 7, wherein the reel holding section has a box-shaped tape housing that is arranged in a plurality of stages in an up-down direction and has an opening that opens in a lateral direction, and the tape housing includes a tray that is rotatably or slidably arranged therein and on which the reel is placed, and a lever that rotates or slides the tray.

9. The component supply device according to claim 6, wherein the feeding mechanism is rotated such that movement speed of the new component supply tape is equivalent to reception speed of the component supply device.

10. The component supply device according to claim 6, wherein the reel holding section has a box-shaped tape housing that is arranged in a plurality of stages in an up-down direction and has an opening that opens in a lateral direction, and the tape housing includes a tray that is rotatably or slidably arranged therein and on which the reel is placed, and a lever that rotates or slides the tray.

11. The component supply device according to claim 1, wherein the reel holding section has a box-shaped tape housing that is arranged in a plurality of stages in an up-down direction and has an opening that opens in a lateral direction, and the tape housing includes a tray that is rotatably or slidably arranged therein and on which the reel is placed, and a lever that rotates or slides the tray.

12. The component supply device according to claim 1, wherein the first feeding path and the second feeding path extend in parallel; and the second feeding path is not provided with any feeding gear that is engaged with the preceding component supply tape.

13. The component supply device according to claim 1, wherein the partition is displaceable to close the partition in a state of covering the first feeding path or to open the partition as to displace the partition away from the first feeding path.

14. The component supply device according to claim 1, wherein
- the first feeding path extends along a top surface of the base;
- the second feeding path is located above the first feeding path across the partition; and
- the feeding gear is provided under the first feeding path and engaged with the new component supply tape from below.

15. A component mounting device comprising the component supply device according to claim 1 that holds the electronic component supplied by the component supply device at a component takeout section to install the electronic component on the circuit board.

16. A component mounting device comprising the component supply device according to claim 2 that holds the electronic component supplied by the component supply device at a component takeout section to install the electronic component on the circuit board.

17. A component mounting device comprising the component supply device according to claim 6 that holds the electronic component supplied by the component supply device at a component takeout section to install the electronic component on the circuit board.

18. A component mounting device comprising the component supply device according to claim 3 that holds the electronic component supplied by the component supply device at a component takeout section to install the electronic component on the circuit board.

19. A component mounting device comprising the component supply device according to claim 7 that holds the electronic component supplied by the component supply device at a component takeout section to install the electronic component on the circuit board.

20. A component mounting device comprising the component supply device according to claim 9 that holds the electronic component supplied by the component supply device at a component takeout section to install the electronic component on the circuit board.

* * * * *